US006621712B2

(12) United States Patent
Siira et al.

(10) Patent No.: US 6,621,712 B2
(45) Date of Patent: Sep. 16, 2003

(54) RACK FOR ELECTRONIC PLUG-IN UNITS

(75) Inventors: Ari Siira, Jääli (FI); Tuomas Jouhten, Oulu (FI); Timo Kärppä, Tupos (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/219,822

(22) Filed: Aug. 16, 2002

(65) Prior Publication Data

US 2003/0031002 A1 Feb. 13, 2003

Related U.S. Application Data

(63) Continuation of application No. PCT/FI01/01124, filed on Dec. 18, 2001.

(30) Foreign Application Priority Data

Dec. 20, 2000 (FI) .............................. 20002806

(51) Int. Cl.⁷ .............................. H05K 7/14; H05K 7/18
(52) U.S. Cl. .................. 361/796; 361/728; 361/729; 361/730; 211/41.17
(58) Field of Search .................. 361/730, 796, 361/732, 726, 727, 728, 729; 211/41, 41.17

(56) References Cited

U.S. PATENT DOCUMENTS

| 2,871,457 A | | 1/1959 | Jencks et al. | |
|---|---|---|---|---|
| 4,361,372 A | | 11/1982 | Majkrzak et al. | |
| 4,713,714 A | * | 12/1987 | Gatti et al. | 360/137 |
| 4,748,539 A | * | 5/1988 | Fukuyama | 361/399 |
| 4,845,591 A | * | 7/1989 | Pavie | 361/391 |
| 5,127,851 A | * | 7/1992 | Hilbert et al. | 439/532 |
| 5,204,929 A | * | 4/1993 | Machall et al. | 385/135 |
| 5,344,332 A | | 9/1994 | Lopez et al. | |
| 5,731,961 A | | 3/1998 | Bernhardt et al. | |
| 6,398,042 B1 | * | 6/2002 | Tabuchi | 211/41.17 |

FOREIGN PATENT DOCUMENTS

| DE | U1 8520797 | 10/1985 |
|---|---|---|
| EP | 973 235 | 1/2000 |

OTHER PUBLICATIONS

SFS 2667, Elektroniikkalaittciden kehikko–ja telinerakenteiden mitoitus (Dimensions of frame and rack structure in electronic devices) published by Finnish Standard Association.

* cited by examiner

Primary Examiner—David Martin
Assistant Examiner—Dameon E Levi
(74) Attorney, Agent, or Firm—Pillsbury Winthrop LLP

(57) ABSTRACT

The invention relates to a rack for electronic plug-in units, comprising a backplane. The backplane comprises at least one connector to which a connector provided in the electronic plug-in unit connects when the plug-in unit is pushed into the rack. The backplane is attached to the rack with a fastener made of a resilient material. A moment arm is formed between a point which attaches the fastener to the rack and the backplane. When the plug-in unit is pushed into the rack, there is a tolerance for alignment of the connectors enabling connection of the connectors. Furthermore, when the plug-in unit is in the rack, the mobility of the backplane prevents the connectors and/or the backplane from breaking as the rack moves.

11 Claims, 5 Drawing Sheets

RACK FOR ELECTRONIC PLUG-IN UNITS

This application is a Continuation of International Application PCT/FI01/01124 filed on the Dec. 18th 2001, which designated the U.S. and was published under PCT Article 21(2) in English.

FIELD

The invention relates to a rack for electronic plug-in units, comprising a backplane, which comprises at least one connector to which a connector provided in the electronic plug-in unit connects when the plug-in unit is pushed into the rack.

BACKGROUND

A rack means a box-like frame into which electronic plug-in units are pushed. The structure can be hierarchical, i.e. the plug-in units can be placed directly in the rack, or alternatively the rack can be provided with subracks in which the plug-in units are placed. In one feasible structure the rack is divided into several compartments by shelves, which support either the plug-in units or the subracks. Since this structure is not relevant to the present invention, in this application the term rack refers to a mechanical structure consisting of one or more entities into which electronic plug-in units are pushed. Racks usually have standard measures, e.g. as described in Finnish standard SFS 2667 Elektroniikkalaitteiden kehikko-ja telinerakenteiden mitoitus (Dimensions of frame and rack structures in electronic devices) published by the Finnish Standards Association, which is incorporated herein by reference. Commercially available racks are usually dimensioned in inches.

A rack can be also protected by placing it in a cabinet. A typical example of a rack placed in a cabinet is a base station or a switching centre. When a rack is placed in open air, the cabinet protects the sensitive electronics from changes in temperature and humidity. The cabinet may also be provided with heating/cooling devices to balance the temperature and humidity. In that case the plug-in units include the electronics of a base station, e.g. transceivers.

A backplane is an essential part of the rack. The backplane comprises inter-board telecommunication routes, and/or telecommunication routes that connect the apparatus to the outside world, and/or the current supply connection. The backplane is usually implemented as a printed circuit board on which current and/or signals pass. The backplane is also known as a motherboard.

The plug-in unit refers to an electronic module which is installed in the rack. The plug-in unit comprises at least one connector which connects to the connector in the backplane when the plug-in unit is pushed into the rack. The connectors usually form a male/female connection. Usually the plug-in unit is provided with a male connector and the backplane with a female connector. The connectors may comprise guide surfaces and/or a pair of connectors may be provided with a pair consisting of a guide pin and a hole, which guide final connecting of the connectors. However, if the connectors are not sufficiently aligned, the guide surfaces do not help but the connector is damaged when the plug-in unit is pushed into the rack. Usually the plastic in the connector body breaks first, after which the connector pins may twist or break. On the other hand, the connector pair may remain undamaged but the attachment of the connector to the backplane or to the plug-in unit may be damaged, e.g. a soldered joint comes loose or a leg breaks. The backplane may also be damaged by inaccurate alignment. For example, a plug-in unit which contains a base station transceiver may weigh 15 kg. When such a heavy plug-in unit is pushed into a rack, one connector or both of the opposite connectors are damaged if they are unaligned. The weight of the plug-in unit is not, however, the only decisive factor but also the fact how fast the installation is carried out. Consequently, the connectors of units of all weights may be damaged upon installation. In practice one plug-in unit may include several connectors and they all may be damaged due to inaccurate alignment. The situation is made worse by the fact that the design of the racks does not usually allow one to see how well the connectors connect when a plug-in unit is pushed into the rack. The reason for this is that the rack may be against the wall and thus one does not have access behind it; on the other hand, the structure is usually enclosed, in which case this would be of no avail. Furthermore, the racks are usually next to one another and one cannot see through the backplane, which in practice makes manual and/or visual alignment of the connectors impossible during installation.

It is known to attach the backplane to the rack so that it cannot move. In that case the manufacture precision has to be very high so as to avoid damage to the connectors at the back of the rack when the plug-in unit is pushed into the rack. To achieve manufacture precision with a desired tolerance, it is possible to use a specific assembly jig where the rack and its backplane are assembled. The correct positioning of the connectors can be checked by using specific dummy plug-in units. The problem related to this solution is that it requires manual work. Furthermore, if a part of the rack or the backplane needs to be changed in field conditions at the final location of the rack, the alignment achieved with the assembly jig is lost. Parts may have to be changed because of damage to a part or when a new version of a part, particularly of the backplane, is introduced. Another problem related to rigid joint of this kind is that when the rack moves, e.g. due to vibration caused by an earthquake or traffic, the connectors may break. This results from the fact that the plug-in unit moves in relation to the backplane and/or the rack chassis. The plug-in units are usually attached to the front of the rack with screws and since they are attached rigidly to the back of the rack only with connectors, the forces generated by the movement of the rack break the connectors. Since in practice the plug-in unit and the backplane cannot be attached to each other so closely that they would function as one piece, they start to vibrate at different frequencies as the rack moves, as a result of which a connector, for example, breaks.

Another solution is to use specific floating connectors which enable blind mating. Blind mating refers to a situation where the alignment of the connectors cannot be seen directly. A floating connector is provided with a certain play in the direction perpendicular to the direction in which the plug-in unit is pushed, i.e. in principle in two directions: up and down in the directions of the x and the y axis and sideways but not in the direction of the z axis, i.e. in the depth direction. The problem associated with floating connectors is that they are expensive: they cost even 5 to 10 times as much as ordinary connectors because they include more parts, even a separate circuit board. Furthermore, the supply of floating connectors is smaller than that of ordinary connectors.

BRIEF DESCRIPTION

The object of the invention is to provide an improved rack. According to an aspect of the present invention, there is provided a rack for electronic plug-in units, comprising: a backplane, which comprises at least one connector to which a connector provided in the electronic plug-in unit connects when the plug-in unit is pushed into the rack; a fastener made of a resilient material for attaching the backplane to the rack so that the backplane can flexibly move in relation to the rack, there being a tolerance for alignment of the connectors enabling connection of the connectors when the plug-in unit is pushed into the rack, and when the plug-in unit is in the rack, the mobility of the backplane prevents the connectors and/or the backplane from breaking as the rack moves; and a moment arm formed between a point which attaches the fastener to the rack and the backplane.

The invention is based on the fact that a backplane is attached to a rack in such a manner that it can flexibly move in relation to the rack. When a plug-in unit is pushed into the rack, there is a tolerance for alignment of the connectors enabling connection of the connectors, and when the plug-in unit is in the rack, the mobility of the backplane prevents the connectors from breaking as the rack moves.

When the solution according to the invention is used, the apparatus does not need to be assembled using an assembly jig, which facilitates the manufacture of the apparatus as well as its maintenance in field conditions. However, the solution is mechanically so simple that it does not increase the production costs. Furthermore, the solution even enables inexpensive production of devices in accordance with Earthquake Zone 4 defined in the NEBS standard (NEBS= Network Equipment–Building System) published by Bellcore.

LIST OF FIGURES

Preferred embodiments of the invention are described below by way of example and with reference to the attached drawings, in which FIG. 1 is a diagonal front view of a rack provided with a fastener which enables flexible movement of a backplane;

DESCRIPTION OF EMBODIMENTS

The structure of a rack will be described with reference to FIG. 1. The rack 100 is usually a cabinet-like mechanical frame made of metal where plug-in units can be placed one on top of another like shelves in a cabinet. The plug-in units are placed either directly in the rack or on top of the shelves attached to the rack 100 or inside subracks provided in the rack 100. However, FIG. 1 does not show shelves or subracks because they are not relevant to the embodiment described here.

Figure 1:
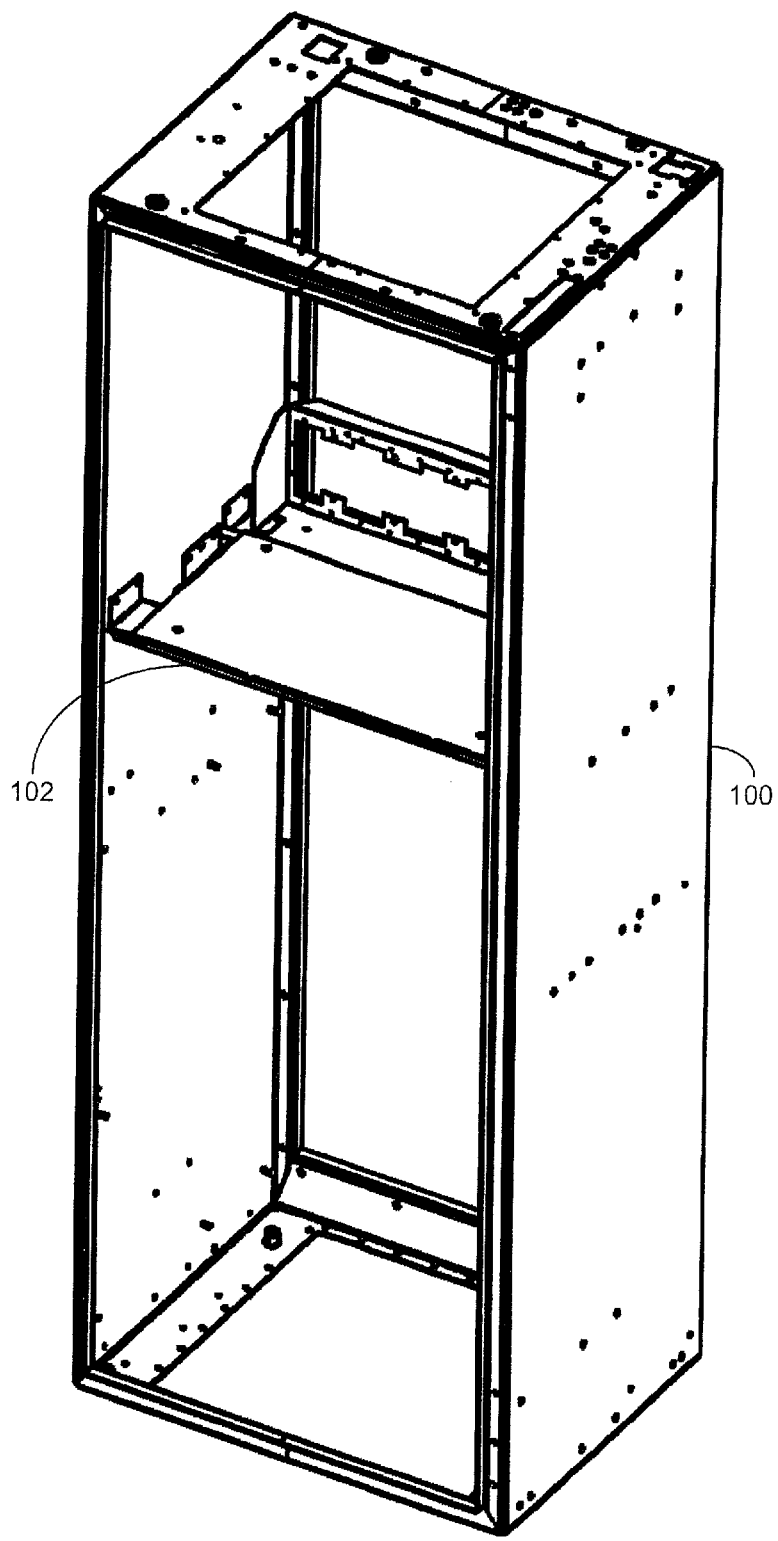

Instead, FIG. 1 shows how a fastener 102 is placed in the rack 100. The fastener 102 is shown as a structure separate from the rack 100, but it is also possible to integrate the fastener 102 into the rack 100.

Figure 2:
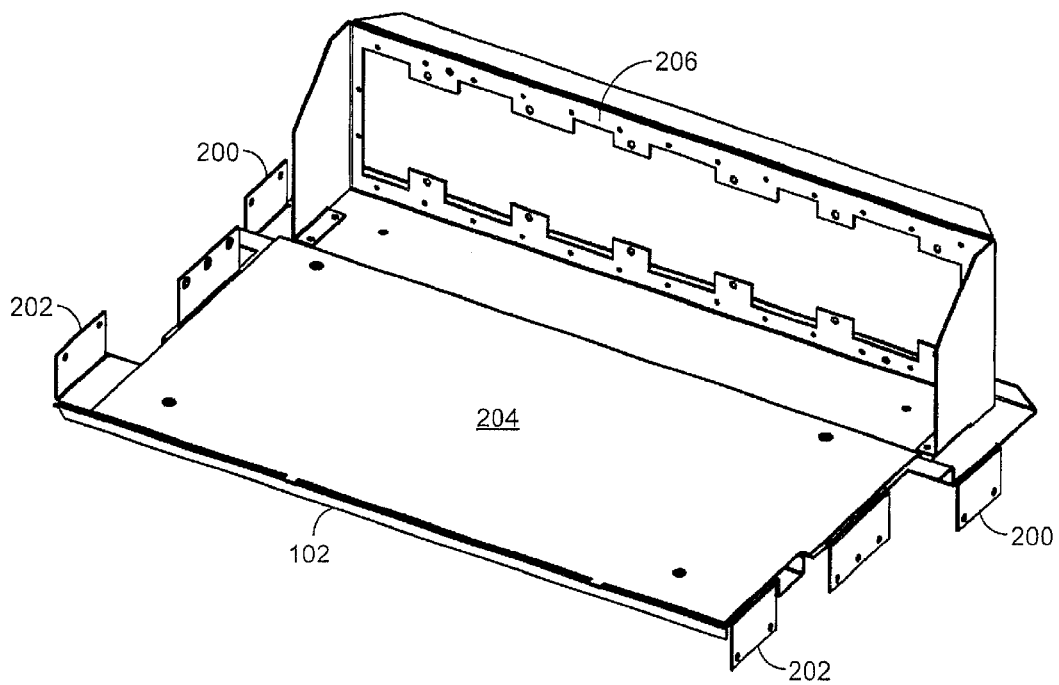
FIG. 2 is a diagonal front view of the fastener.

FIG. 2 shows the fastener, 102 in greater detail. The fastener 102 shown is a part separate from the rack 100, but it could also be integrated into the rack 100. The backplane 300 is preferably attached using a fastener 102 made of a resilient material, which can be e.g. metal or plastic. The fastener 102 shown in FIG. 2 is a bent metal piece. In an embodiment the fastener 102 is an L-shaped piece. In that case the long side 204 of the piece 102 constitutes a base plate on which the plug-in units are placed crosswise and into an upright position. The short side 206 of the piece 102 constitutes a surface to which the backplane is attached. As is seen in FIG. 2, part of the short side 206 has been cut off. The backplane is installed in place of the part that has been cut off. The piece is also provided with bent fastening areas 200 for the back part and fastening areas 202 for the front part. The fastening areas 200, 202 in question are used for fastening the piece 102 to the rack 100.

Figure 3:
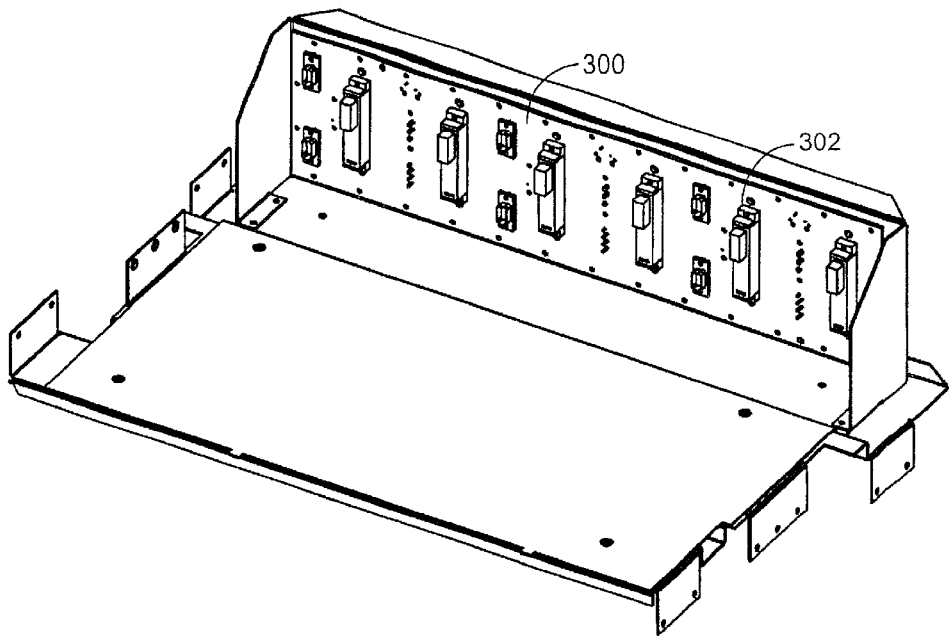
FIG. 3 is a diagonal front view of the fastener to which the backplane has been attached.

FIG. 3 shows the fastener 102 of FIG. 2 to which the backplane 300 has been attached. The backplane 300 is typically a circuit board which is attached to the fastener 102 e.g. with screws or by another fastening method. The backplane 300 comprises one or more connectors 302.

Figure 4:
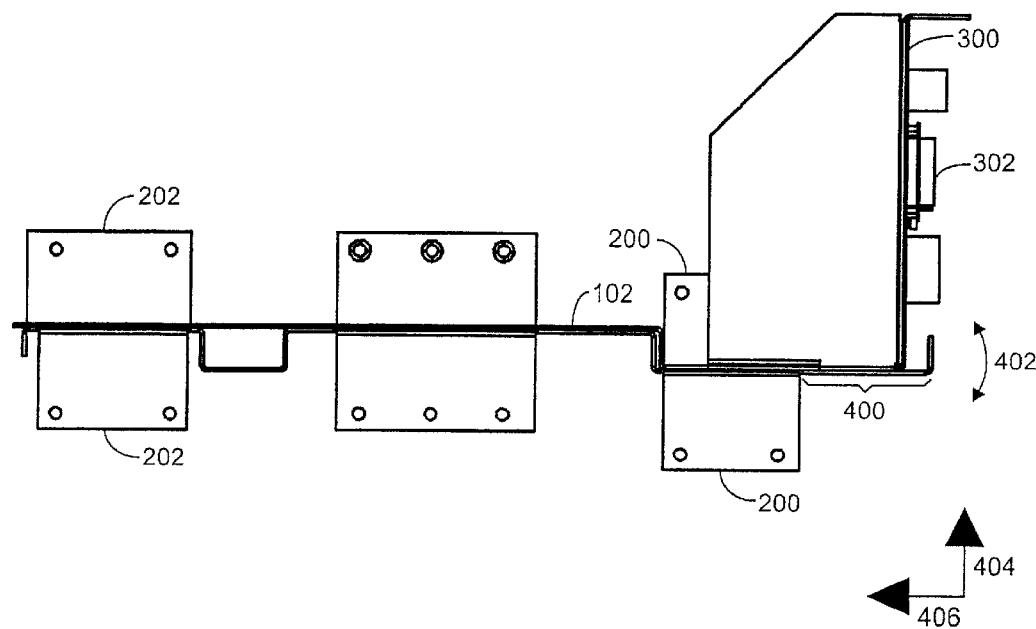
FIG. 4 is a side view of the fastener to which the backplane has been attached.

FIG. 4 is a side view of the fastener 102 and the backplane 300 shown in FIG. 3. The backplane 300 comprises at least one connector 302 to which the connector in the electronic plug-in unit connects as the plug-in unit is pushed into the rack 100. The backplane 300 is attached to the rack in such a manner that the backplane 300 can move flexibly in relation to the rack 100. When the plug-in unit is pushed into the rack 100, there is a tolerance for alignment of the connectors enabling-connection of the connectors. Thanks to the flexible movement, the mobility of the backplane 300 prevents the connectors and/or the backplane 300 from breaking as the rack 100 moves when the plug-in unit is in the rack 100.

It can be seen from FIG. 4 that when the fastening areas 200, 202 of the fastener 102 are attached to the rack 100, the backplane 300 can move up and down in direction 402 thanks to the resiliency of the fastener 102. When the movement in direction 402 is examined, it can be noticed that it consists of two components:

the flexible movement of the backplane 300 is a movement 406 which is opposite to the backplane 300 surface, and the flexible movement of the backplane 300 is a movement 404 which is parallel with the backplane surface 300.

When the attachment method described above is used, a moment arm 400 is formed between the point 200 that connects the fastener 102 to the rack 100 and the backplane. The spring force is preferably controlled by the length of the moment arm 400 and/or the material of the fastener 102 so as to achieve the desired force.

Figure 5:
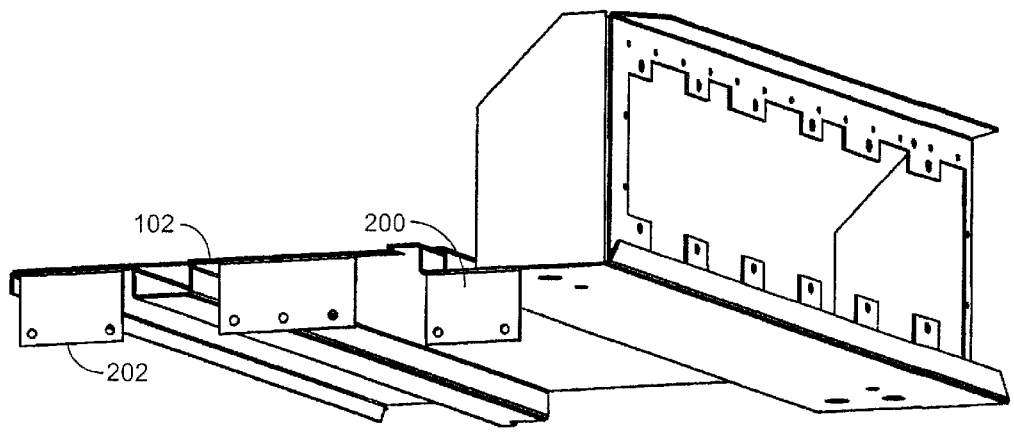
FIG. 5 illustrates the fastener diagonally from below.

FIG. 5 illustrates the fastener 102 diagonally from below, showing clearly how the shorter branch of the L-shaped fastener 102 can freely move in relation to the point formed by the rearmost fastening area 200. The purpose of the foremost fastening area 202 is to stiffen the longer branch of the L-shaped fastener 102 to make it function as the base plate.

Figure 6:
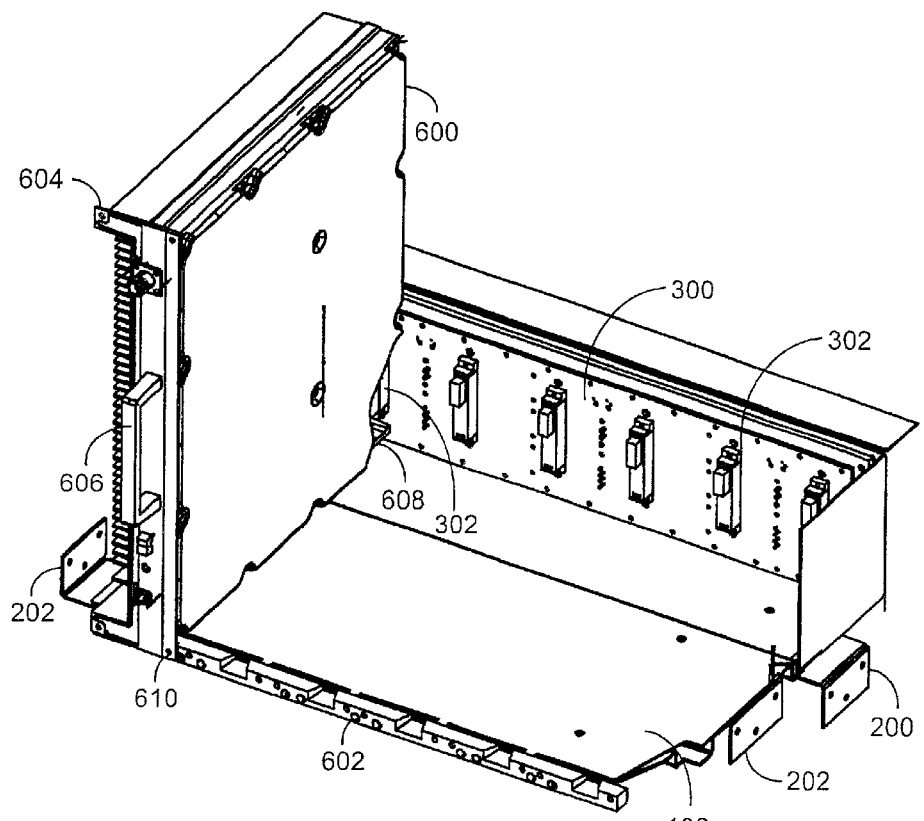
FIG. 6 is a diagonal front view of a plug-in unit pushed into the backplane attached to the fastener.
Figure 7:
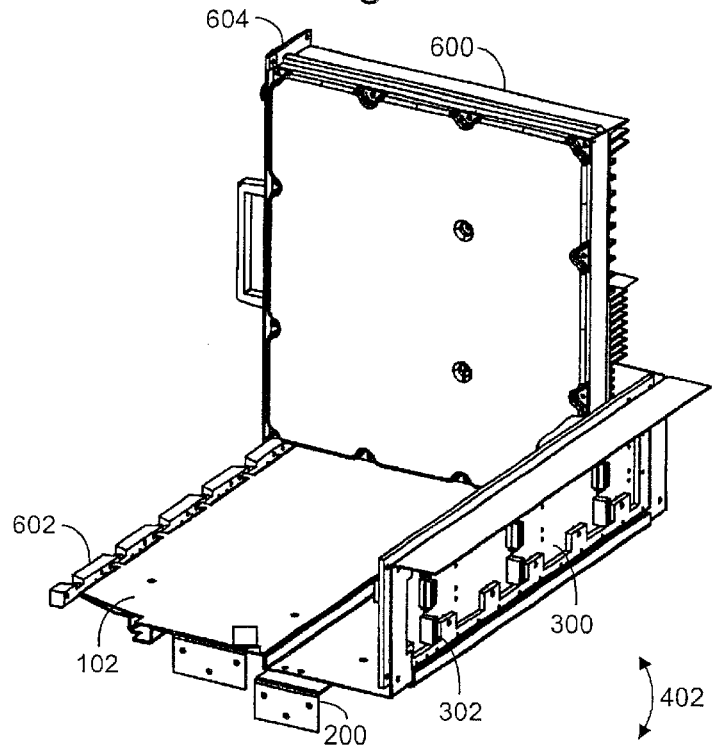
FIG. 7 illustrates the plug-in unit pushed into the backplane attached to the fastener seen diagonally from behind.

FIG. 6 is a diagonal front view of an electronic plug-in unit 600 which has been pushed into the backplane 300 attached to the fastener 102. The plug-in unit 600 comprises at least one connector 608 to which the connector 302 of the backplane 102 connects as the plug-in unit 600 is pushed into the rack 100. Thanks to the flexible attachment of the backplane 300 to the rack 100 either via a connector 102 or directly, there is a tolerance for alignment of the connectors 302 enabling connection of the connectors 302, 608. The plug-in unit 600 may be provided with a handle 606 which facilitates handling of the plug-in unit, particularly when it is pushed into the rack 100 and pulled out. In that case the plug-in unit 600 comprises fastening areas 604, 610, e.g. in the upper and the lower part of the front part of the plug-in unit 600. Correspondingly, the rack 100 comprises fastening areas 602 to which the fastening areas 604, 610 of the plug-in unit 600 are attached e.g. with screws. In that case the front part of the plug-in unit 600 is attached rather firmly to the rack 100. The back part of the plug-in unit 600 is attached to the backplane 300 with connectors 608, 302, the backplane being able to move flexibly in relation to the rack 302. It should be noted that the flexibility of the fastener 102 generates spring force which tries to close the connection between the connectors 302, 608. Thus the backplane 300 will not remain permanently in an abnormal position but tries to return to the normal position. The yielding thus occurs during the installation of the plug-in unit 600 and thereafter in a situation where the rack is subjected to strong vibration due to an earthquake, for example. FIG. 7 illustrates the situation of FIG. 6 diagonally from behind, showing the direction 402 of the yielding movement. The direction 402 of the yielding movement can again be thought of as consisting of two components:

the fastener 102 bends in the direction perpendicular to the direction in which the plug-in unit is pushed 600, and the fastener twists in the direction in which the plug-in unit 600 is pushed.

In other words, the yielding movement 402 consists of two types of yielding: bending and twisting.

Figure 8:
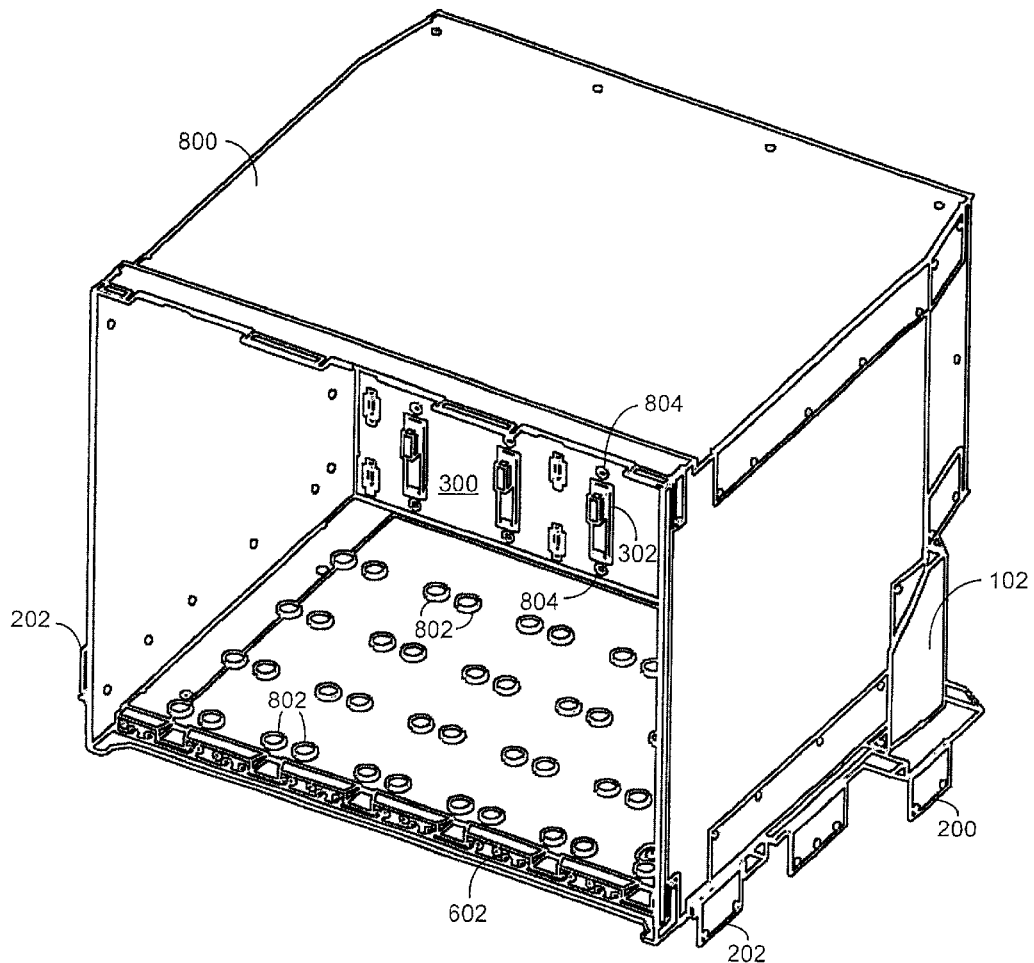
FIG. 8 is a diagonal front view of a subrack which is placed on top of the fastener to the front of the backplane.

FIG. 8 is a diagonal front view of a subrack 800, which is placed on top of the fastener 102 to the front of the backplane 300. As was stated earlier, the subrack 800 is a component which is placed in the rack 100. The purpose of the subrack 800 is to function e.g. as a supporting structure and/or as electromagnetic and/or physical shielding of the plug-in units 600. In the rack 100 described in our examples the fastener 102 constitutes a rigid base plate, in which case the main purpose of the subrack 800 is to function as a protective structure. In our example the above-mentioned fastening areas 602 of the rack 100 to which the fastening areas 604, 610 of the plug-in unit 600 are attached e.g. with screws are integrated into the subrack 800. The subrack 800 is correspondingly attached either to the fastener 102 or directly to the rack 100 with screws. FIG. 8 also shows guides 802 arranged in the subrack. The guides 802 are implemented e.g. with buttons pressed onto the subrack in the manner described and the plug-in unit 600 is pushed between the buttons. The purpose of the guides 802 is to guide the plug-in unit towards the backplane 300. The backplane may be provided with guides 804, which in our example are holes which the pins provided in the plug-in unit 600 engage when the plug-in unit 600 is pushed into the rack. The purpose of the guides 804 is to guide connection of the connectors 302, 608.

Even though the invention was described above with reference to the example according to the accompanying drawings, it is clear that the invention is not limited thereto but may be modified in various ways within the inventive concept disclosed in the appended claims.

We claim:

1. An assembly for holding electronic plug-in units, comprising:

a rack;

a backplane, which comprises at least one connector to which a connector provided in the electronic plug-in unit connects when the plug-in unit is pushed into the rack; and a fastener made of resilient material for attaching the backplane to the rack so that the backplane can flexibly move in relation to the rack, there being a tolerance for alignment of the connectors enabling connection of the connectors when the plug-in unit is pushed into the rack, and when the plug-in unit is in the rack, the mobility of the backplane prevents the connectors and/or the backplane from breaking as the rack moves;

wherein the fastener defines a moment arm between a point where the fastener attaches to the rack and a point where the fastener attaches to the backplane.

2. A rack according to claim 1, wherein the flexible movement of the backplane is a movement, which is opposite to the backplane surface.

3. A rack according to claim 1, wherein the flexible movement of the backplane is a movement, which is parallel with the backplane surface.

4. A rack according to claim 1, wherein the fastener is a separate piece.

5. A rack according to claim 1, wherein the fastener is integrated into the rack.

6. A rack according to claim 1, wherein the fastener is a bent piece.

7. A rack according to claim 6, wherein the fastener is an L-shaped piece.

8. A rack according to claim 1, wherein a spring force is controlled by the length of the moment arm and/or the material of the fastener so as to achieve the desired force.

9. A rack according claim 1, wherein the fastener bends in the direction perpendicular to the direction in which the plug-in unit is pushed.

10. A rack according to claim 1, wherein the fastener twists in the direction in which the plug-in unit is pushed.

11. A rack according claim 1, wherein the resiliency of the fastener generates spring force, which tries to close the connection between the connectors.

* * * * *